United States Patent

[11] 3,603,833

[72] Inventors Ralph Andre Logan
Morristown;
Walter Rosenzweig, West Orange; William Wiegmann, Middlesex, all of, N.J.
[21] Appl. No. 11,413
[22] Filed Feb. 16, 1970
[45] Patented Sept. 7, 1971
[73] Assignee Bell Telephone Laboratories, Incorporated
Murray Hill, N.J.

[54] ELECTROLUMINESCENT JUNCTION SEMICONDUCTOR WITH CONTROLLABLE COMBINATION COLORS
9 Claims, 2 Drawing Figs.

[52] U.S. Cl. .......... 313/108 D, 148/171, 307/311, 317/235 N
[51] Int. Cl. .......... H05b 33/16
[50] Field of Search .......... 148/171; 313/108 D; 317/235 N; 307/311

[56] References Cited
UNITED STATES PATENTS

| | | | |
|---|---|---|---|
| 3,365,630 | 1/1968 | Logan et al. .......... | 317/237 |
| 3,470,038 | 9/1969 | Logan et al. .......... | 148/171 |

*Primary Examiner*—Ronald L. Wibert
*Assistant Examiner*—Edward S. Bauer
*Attorneys*—R. J. Guenther and Arthur J. Torsiglieri

ABSTRACT: An electroluminescent PN junction gallium phosphide diode is fabricated with the P-type zone rich in zinc oxygen pairs and the N-type zone rich in isoelectronic nitrogen. In this diode, the apparent color of the emitted light can be controlled by varying the electrical current in the diode, from the red through the yellow to the green portions of the color spectrum. Thereby, an electroluminescent diode device is afforded, having a threefold (or more) positive standby signal characteristic.

INVENTORS R. A. LOGAN
W. ROSENZWEIG
W. WIEGMANN
BY D Caplan
ATTORNEY

ELECTROLUMINESCENT JUNCTION SEMICONDUCTOR WITH CONTROLLABLE COMBINATION COLORS

FIELD OF THE INVENTION

This invention relates to the field of semiconductor devices, more particularly to electroluminescent semiconductor devices, i.e., devices which can emit light in response to applied voltages.

BACKGROUND OF THE INVENTION

In the prior art, there are various PN junction semiconductor electroluminescent structures which can emit visible light at room temperature in response to a forward voltage bias. For example, in the U.S. Pat. No. 3,470,038 issued to R. A. Logan (one of the inventors herein) and H. G. White on Sept. 30, 1969, there is described a PN junction gallium phosphide semiconductor device containing zinc-oxide-type molecules, which emits red light at room temperature in response to a forward electrical current. Moreover, in the U.S. Pat. application of R. A. Logan, H. G. White, and W. Wiegmann (two of the inventors in common with the present application) Ser. No. 740,903 filed on June 28, 1968, there is described a method of making a PN junction gallium phosphide device containing isoelectronic nitrogen atoms, which emits green light at room temperature in response to a forward current. However, each of these devices is restricted to the emission of visible light of one color alone; and thereby each is restricted in its use as a standby signal device to a two-state logic-type element, i.e., "on" or "off," having only a singlefold positive standby signal characteristic.

SUMMARY OF THE INVENTION

According to this invention, a three or more positive state ("standby signal") electroluminescent semiconductor device is provided by a PN junction gallium phosphide single crystal diode, in which the P-type conductivity portion is rich in zinc-oxide-type molecules and the N-type conductivity portion is rich in isoelectronic traps due to nitrogen. It should be understood that, as used herein, the term zinc-oxide-type molecules includes zinc and oxygen substitutional atoms at next-neighboring lattice sites in the gallium phosphide crystal. Thereby, the PN junction diode can emit combination colors having a "hue" which can be varied continuously from red through green, in response to different applied forward electrical currents. Thus, an electroluminescent device is provided with a threefold (or more) standby positive signal characteristic, that is, a hue corresponding to red, yellow, or green light, for example.

In a specific embodiment of this invention, a P-type gallium phosphide monocrystalline semiconductor, rich in zinc-oxide-type molecules, is the substrate of an N-type epitaxial layer of N-type gallium phosphide semiconductor which is rich in traps due to isoelectronic nitrogen. By traps due to isoelectronic nitrogen are meant impurity levels within the forbidden energy band of a semiconductor crystal which function neither as donor nor acceptor levels but as capture centers of migrating donors or acceptors in the crystal; and the nitrogen is in the same electronic shell group ("isoelectronic") as one of the constituent elements of gallium phosphide, i.e., group V. Advantageously, the N-type conductivity of the epitaxial layer is due to the donor impurity sulfur, and the P-type conductivity of the substrate is due to excess zinc acceptor impurity. Thereby, a PN junction gallium phosphide single crystal structure is formed with the aforementioned threefold (or more) positive standby signal characteristic.

This invention, together with its objects, features, and advantages may be better understood from the following detailed description when read in conjunction with the drawing in which:

FIG. 1 is a diagram, not to scale for the sake of clarity, of semiconductive apparatus, including an electroluminescent device in accordance with a specific embodiment of this invention; and FIG. 2 is a graph showing the equivalent wavelength of light emitted by the device shown in FIG. 1 versus forward current.

DETAILED DESCRIPTION

Figure 1:
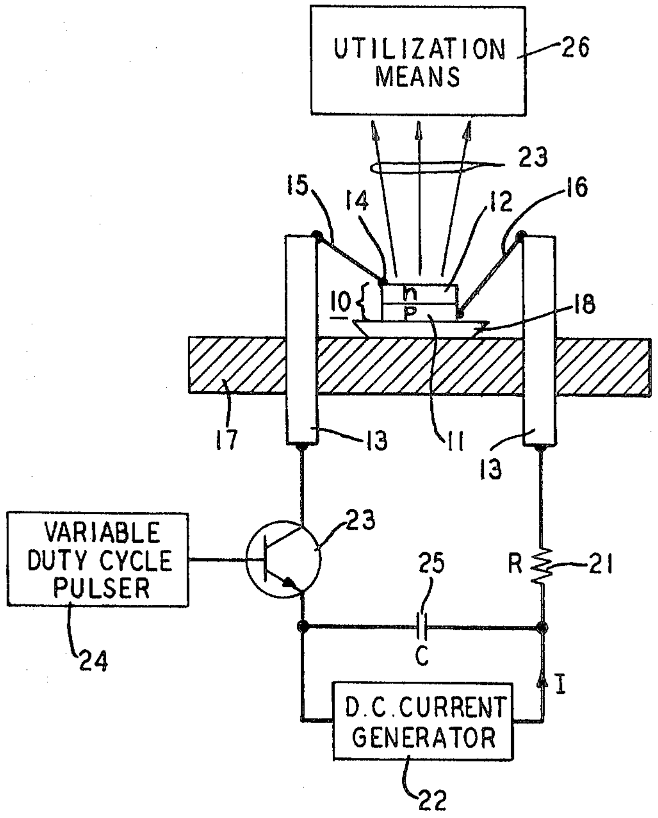

FIG. 1 shows an electroluminescent semiconductive apparatus which includes the electroluminescent PN junction diode device 10, in accordance with a specific embodiment of the invention. The device 10 contains a P-type single crystal zone 11 and an N-type epitaxial zone 12, which can be fabricated as described in detail below. The P-type zone 11 contains zinc and oxygen atoms in the gallium phosphide crystal structure thereof, advantageously in zinc-oxygen atomic pairs as next neighbor impurities, thereby forming zinc-oxide-type molecules in the gallium phosphide lattice sites. Moreover, this zone 11 also contains further zinc atoms, in excess of those in the zinc-oxygen pairs, which function as acceptor impurities and thereby cause the conductivity of zone 11 to be P-type. The concentration of oxygen atoms forming the zinc-oxygen pairs in the gallium phosphide zone 11 can be in the range of about $2\times10^{17}$ to $4\times10^{17}$ per cm.$^3$, typically about $3\times10^{17}$ per cm. $^3$; whereas the net significant acceptor impurity concentration of zinc atoms in excess of those forming the zinc-oxygen pairs can be in the range of about $2\times10^{17}$ to $1\times10^{18}$ per cm.$^3$, typically about $5\times10^{17}$ per cm.$^3$.

The N-type epitaxial semiconductor zone 12 is rich in isoelectronic traps due to nitrogen atoms in a concentration in the range of about $2\times10^{18}$ to $2\times10^{19}$ per cm.$^3$, typically about $10^{19}$ per cm.$^3$. Moreover, advantageously this epitaxial zone 12 is of N-type conductivity, due to a net significant donor impurity concentration of sulfur atoms in the range of about $2\times10^{16}$ to $5\times10^{17}$ per cm.$^3$, typically about $10^{17}$ per cm.$^3$.

The electroluminescent device 10 typically has a cross section of about $0.6\times10^{13}$ cm.$^2$, and is mounted on a suitable electrically conducting metal header 13. Ohmic contact is made to the N-type zone 12 by means of a tin alloy contact 14 and a gold wire 15 soldered thereto; whereas ohmic contact is made to the P-type zone 11 by means of a zinc-gold alloy wire 16. Absorption of emitted light by poorly reflecting metal surfaces is prevented by the use of a glass base 17 upon which the header 13 is constructed. The device 10 is cemented to the glass base 17 by means of a suitable resin layer 18 having a refractive index for the emitted light which aids in the emergence of light in accordance with known interference principles.

As further illustrated in FIG. 1, the header 13 is connected through a resistor 21 to a DC generator 22 of a current I, and to a control transistor 23. This transistor 23 is controlled by a variable duty cycle pulser 24. The pulse width of the pulser 24 is typically about 1 microsecond for the "ON" pulses to the transistor 23. The resistor 21 typically has a resistance of about 10 ohms while the current I is typically about $10^{14}$ amps. A capacitor 25, typically about a microfarad, is connected across the current generator 25 in order to furnish a relatively constant voltage during a given duty cycle of the pulser 24, especially during the "ON" portions of the duty cycle. It is desirable for this purpose that the RC time constant of the resistor 21 in combination with the capacitor 25 be at least about an order of magnitude greater than the width of the "ON" pulses of the pulser 24.

For all duty cycles, the average current in the diode device 10 is the same, i.e., the current I supplied by the current generator 22. For example, at 100-percent duty cycle the current in diode 10 is simply DC, and the instantaneous magnitude of the current in the diode 10 is always equal to I itself; whereas, at a small 0.01-percent duty cycle, the instantaneous magnitude of the current in the diode 10 (during the "ON" period of the transistor 23) is equal to $10^4$ I. Thereby, the instantaneous current in the diode 10 can be varied by a factor of $10^4$, for example. Thus, with large duty cycles the "hue" of the light emitted by the diode device 10 tends towards the red, and with small duty cycles the "hue" of the light tends toward the green.

Utilization means 26 collects the light beam 23 emitted by the electroluminescent device 10, for detection and utilization of this light beam.

In order to fabricate the device 10, a P-type gallium phosphide substrate 11 is prepared by conventional solution growth technique. A suitable amount, typically about 12.5 grams, of gallium are placed in a silica tube or other suitable vessel, and heated under vacuum to a temperature sufficient to form a melt, about 600° C. The tube containing the gallium phosphide solution is removed from the vacuum system and the desired impurity dopants are added. For this purpose, about 1.5 grams of gallium phosphide, 8.2 milligrams of zinc, and 6.7 milligrams of gallium oxide typically are added to the resultant gallium phosphide solution. Then the tube with its contents is evacuated and sealed under vacuum, and placed in a furnace whereby the temperature of the contents of the tube is maintained above the melting point thereof (about 1,180° C.) for about 1 to 12 hours, typically about 2 hours. Thereafter, the temperature of the tube and its contents are lowered at a rate ranging from one-half degree C. to 60° C. per hour, typically 5° C. per hour, until the temperature reached about 900° C. Then, the heating unit is turned off at that point and the tube and its contents are permitted to cool to room temperature.

The desired P-type gallium phosphide crystal, typically 250×300×30 mils in thickness, is recovered by a conventional procedure, typically by digestion in nitric acid or hydrochloric acid. The resultant P-type gallium phosphide crystal 11 furnishes the substrate for the growth of the N-type epitaxial layer 12 thereon.

The epitaxial layer 12 is grown by a modified conventional solution epitaxial technique. The substrate crystal 11 is polished by conventional techniques, etched for about 15 seconds in aqua region, and placed at one end of a suitable boat, typically a pyrolitically fired graphite boat enclosed in a quartz tube. At the opposite end of the boat from the crystal 11 is inserted a charge (mixture) of typically about 2 grams gallium, 0.2 gram gallium phosphide. The entire assembly is heated to an elevated temperature, typically about 1,075° C., in a hydrogen gas ambient, the charge and the substrate being initially kept separated until the highest temperature in the heating is attained. The hydrogen gas typically contains about one-tenth percent ammonia ($NH_3$) as well as traces of sulfur provided by an auxiliary furnace containing lead sulfide at about 100° C. The ammonia and the sulfur react with the saturated molten gallium solution. The boat is then tipped so that the molten gallium solution flows over the substrate crystal 11. Following this, the furnace containing the boat is cooled to about 900° C., the quartz tube is removed, and the boat with its contents is permitted to cool to room temperature. The crystal 11 now bears an epitaxially grown N-type gallium phosphide layer 12 rich in nitrogen (from the ammonia in the hydrogen gas). This crystal 11 with the epitaxial layer 12 thereon is recovered from the boat by digestion in a suitable acid solution, typically nitric acid. The structure is lapped to a suitable thickness, thereby forming the semiconductor device 10.

Ohmic contacts to the device 10 are made by conventional techniques. Typically, this is achieved by simultaneously alloying the gold-zinc wire 16 to the P-type substrate 11 and alloying the tin contact 14 to the N-type epitaxial layer 12. External contact to the tin contact 14 is made for example by soldering the gold wire 15 thereto. The resultant structure is then mounted in the header 13, as shown in FIG. 1.

Figure 2:
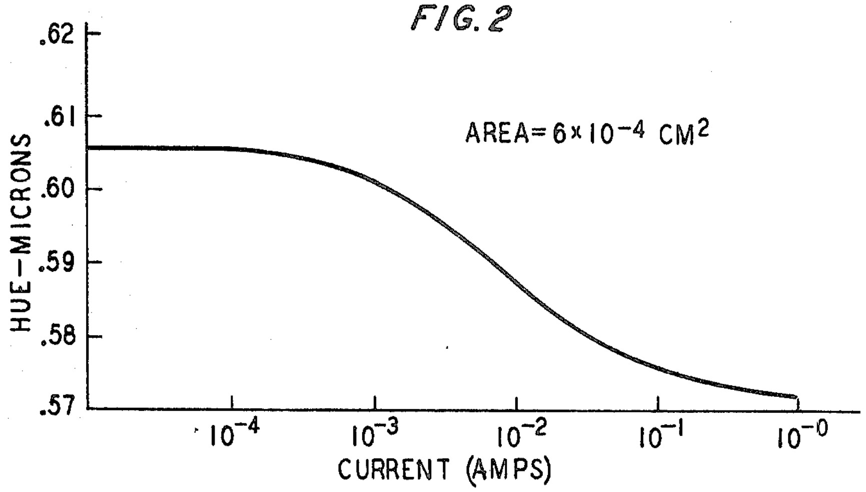

FIG. 2 shows a plot of the equivalent wavelength ("hue") of the light beam 23 emitted by the typical device 10 versus forward instantaneous current through this device 10. By equivalent wavelength is meant the wavelength of that monochromatic source which appears to have the same color as that of the light beam 23. The abscissa in FIG. 2 can be converted into current density by noting that this plot is for a device 10 having a cross section of $0.6\times10^{13}$ cm.$^2$. Thus, $6\times10^{13}$ amps of current is equivalent to a current density of 10 amps/cm$^2$. From FIG. 2, it is clear that an instantaneous current of about $10^{14}$ amps is useful for the emission of red light by the device 10; whereas an instantaneous current of about $10^0$ amps is useful for the production of green light; while an instantaneous current of about $10^{12}$ amps is useful for the emission of yellow light by the typical device 10. Thus, the device 10 in the arrangement shown in FIG. 1 provides a standby signal apparatus, having a multitude of possible positive signal states.

While this invention has been described in detail with respect to a particular choice of materials, it should be obvious to the skilled worker that various other materials can be used in the invention. For example, the impurity tellurium or selenium can be used instead of sulfur, in order to make the gallium phosphide N-type semiconductor. Moreover, the substrate can be N-type and the epitaxial layer P type, instead of vice versa as described above and both the N and the P region could be formed by successive epitaxial growths onto a substrate crystal.

Finally, it should be understood that, with some sacrifice of efficiency, both types of radiative centers can be introduced into a single region of the crystal alone, that is, both the isoelectronic nitrogen traps and the zinc-oxide-type molecules can be introduced into the P-type region of the gallium phosphide region. This can be accomplished by introducing the nitrogen, in the form of ammonia, into the ambient during the solution growth of the P-type gallium phosphide substrate rich in zinc-oxide pairs.

What is claimed is:

1. An electroluminescent device which comprises:

a semiconductive gallium phosphide body containing a first zone of P-type conductivity and a second zone of N-type conductivity forming a PN junction with the first zone, the first zone being rich in zinc-oxygen pairs and the second zone being rich in nitrogen atoms forming isoelectronic traps therein.

2. A device according to claim 1 in which the concentration of nitrogen in the second zone is about $10^{19}$ atoms per cm$^3$.

3. A device according to claim 1 in which the second zone is a layer which has been epitaxially grown on the first zone serving as a substrate therefor, the first zone being a single crystal.

4. A device according to claim 3 in which the second zone contains a net significant donor impurity concentration of about $10^{17}$ sulfur atoms per cm$^3$.

5. A device according to claim 4 in which the concentration of nitrogen in the second zone is about $10^{19}$ atoms per cm$^3$.

6. A device according to claim 1 in which the concentration of zinc oxide in the first zone is $3\times10^{17}$ per cm.$^3$ and in which the first zone further contains a net significant acceptor impurity concentration of $5\times10^{17}$ zinc atoms per cm$^3$.

7. Electroluminescent apparatus which comprises:

a. an electroluminescent device in accordance with claim 1; and b. means for causing an electrical current of controllable magnitude to flow across the PN junction, in order to control the color hue of the light emitted by the body.

8. An electroluminescent apparatus in accordance with claim 7 in which said means include a DC current source which supplies the electrical current and which is controlled by a pulser which is characterized by a controllable duty cycle.

9. An electroluminescent device which comprises:

a semiconductive gallium phosphide body containing a first zone of P-type conductivity and a second zone of N-type conductivity forming a PN junction with the first zone, the body being rich in zinc-oxygen pairs and in nitrogen atoms forming isoelectronic traps therein.